(12) United States Patent
Oh et al.

(10) Patent No.: US 9,880,781 B2
(45) Date of Patent: Jan. 30, 2018

(54) STORAGE DEVICE AND OPERATING METHOD OF STORAGE DEVICE

(71) Applicant: SAMSUNG ELECTRONICS CO., LTD., Suwon-si, Gyeonggi-do (KR)

(72) Inventors: Yonggeun Oh, Ansan-si (KR); Dae-Ho Kim, Hwaseong-si (KR); Chul-Woo Lee, Suwon-si (KR); Gyucheol Han, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/017,984

(22) Filed: Feb. 8, 2016

(65) Prior Publication Data
US 2016/0306592 A1    Oct. 20, 2016

(30) Foreign Application Priority Data
Apr. 14, 2015    (KR) .................... 10-2015-0052559

(51) Int. Cl.
*G06F 3/06*    (2006.01)
*G11C 7/04*    (2006.01)
(Continued)

(52) U.S. Cl.
CPC .............. *G06F 3/0653* (2013.01); *G11C 7/04* (2013.01); *G11C 7/1045* (2013.01);
(Continued)

(58) Field of Classification Search
CPC .... G06F 3/0634; G06F 3/0653; G06F 3/0619; G06F 3/0679; G11C 7/04; G11C 11/40626
See application file for complete search history.

(56) References Cited

U.S. PATENT DOCUMENTS 7,064,994 B1* 6/2006 Wu ..................... G06F 1/206
                                                  365/211
7,158,911 B2    1/2007 Gunther et al.
(Continued)

FOREIGN PATENT DOCUMENTS

KR    1020130080305    7/2013
KR    1020140021283    2/2014
(Continued)

*Primary Examiner* — Tuan Thai
*Assistant Examiner* — Alexander Yoon
(74) *Attorney, Agent, or Firm* — F. Chau & Associates, LLC

(57) ABSTRACT

A storage device is provided which includes a nonvolatile memory and a temperature sensor. The temperature sensor is configured to detect a temperature of the storage device. The temperature sensor is configured to output temperature information. The storage device includes a memory controller. The memory controller is configured to access the nonvolatile memory in response to a request of an external host device. The memory controller is configured to obtain the temperature information from the temperature sensor according to a first period in a first mode. The temperature sensor is configured to obtain the temperature information from the temperature sensor according to a second period in a second mode. The second period is shorter than the first period.

19 Claims, 12 Drawing Sheets

(51) Int. Cl.
  *G11C 7/10*   (2006.01)
  *G11C 16/04*  (2006.01)
(52) U.S. Cl.
  CPC ........ *G11C 16/0483* (2013.01); *G06F 3/0619* (2013.01); *G06F 3/0679* (2013.01)

(56) References Cited

U.S. PATENT DOCUMENTS

| | | | |
|---|---|---|---|
| 7,191,088 B1 | 3/2007 | Reed et al. | |
| 7,272,063 B1* | 9/2007 | Egerer | G11C 7/04 |
| | | | 365/211 |
| 7,493,228 B2 | 2/2009 | Kwa et al. | |
| 7,549,177 B2 | 6/2009 | Diefenbaugh et al. | |
| 7,679,133 B2 | 3/2010 | Son et al. | |
| 8,510,740 B2 | 8/2013 | Salsbery et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2002/0066047 A1* | 5/2002 | Olarig | G06F 1/206 |
| | | | 713/323 |
| 2002/0188899 A1* | 12/2002 | Yamazaki | G11C 29/028 |
| | | | 714/718 |
| 2004/0019738 A1* | 1/2004 | Kahn | G06F 1/206 |
| | | | 711/104 |
| 2006/0161375 A1* | 7/2006 | Duberstein | G06F 1/206 |
| | | | 702/132 |
| 2009/0091996 A1* | 4/2009 | Chen | G11C 7/04 |
| | | | 365/212 |
| 2011/0233648 A1 | 9/2011 | Seol et al. | |
| 2012/0179416 A1 | 7/2012 | Anderson et al. | |
| 2013/0169347 A1 | 7/2013 | Kim et al. | |
| 2013/0297094 A1 | 11/2013 | Yao et al. | |
| 2014/0032949 A1 | 1/2014 | Kim et al. | |
| 2014/0240031 A1 | 8/2014 | Vadakkanmaruveedu et al. | |
| 2014/0281311 A1* | 9/2014 | Walker | G06F 3/0631 |
| | | | 711/162 |
| 2014/0324245 A1 | 10/2014 | Kwon et al. | |
| 2015/0301744 A1 | 10/2015 | Kim et al. | |
| 2016/0239235 A1* | 8/2016 | Chung | G06F 3/0629 |

FOREIGN PATENT DOCUMENTS

| | | |
|---|---|---|
| KR | 1020140128118 | 11/2014 |
| KR | 1020150120213 | 10/2015 |

* cited by examiner

STORAGE DEVICE AND OPERATING METHOD OF STORAGE DEVICE

CROSS-REFERENCE TO RELATED APPLICATION

This application claims priority under 35 U.S.C. §119 to Korean Patent Application No. 10-2015-0052559 filed Apr. 14, 2015, in the Korean Intellectual Property Office, the disclosure of which is incorporated by reference herein in its entirety.

TECHNICAL FIELD

Exemplary embodiments of the present inventive concept relate to a storage device, and more particularly to an operating method of the storage device.

DISCUSSION OF RELATED ART

A storage device may store data in response to a host device, such as a computer, a smartphone, and a smart pad. The storage device may include a device (e.g., hard disk drive), which stores data on a magnetic disk, or a semiconductor memory, such as solid state drive or memory card. The storage device may be a device which stores data on a nonvolatile memory.

A nonvolatile memory may be a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), or a ferroelectric RAM (FRAM).

With the advancement of semiconductor fabrication technology, there may be increases in an operating speed of host devices communicating with the storage device, such as a computer, a smart phone, and a smart pad. The capacity of storage devices and host devices of the storage device may also continue to increase. Thus, there may be storage devices having an increased operating speed.

SUMMARY

Exemplary embodiments of the present inventive concept may provide a storage device and an operating method of the storage device which may increase a speed of the storage device.

Exemplary embodiments of the present inventive concept provide a storage device which includes a nonvolatile memory and a temperature sensor. The temperature sensor is configured to detect a temperature of the storage device. The temperature sensor is configured to output temperature information. The storage device includes a memory controller. The memory controller is configured to access the nonvolatile memory in response to a request of an external host device. The memory controller is configured to obtain the temperature information from the temperature sensor according to a first period in a first mode. The temperature sensor is configured to obtain the temperature information from the temperature sensor according to a second period in a second mode. The second period is shorter than the first period.

The memory controller may be configured to operate in the first mode when the temperature information indicates a temperature lower than a first temperature. The memory controller may be configured to operate in the second mode when the temperature information indicates a temperature higher than or equal to the first temperature and lower than a second temperature higher than the first temperature. The memory controller may be configured to operate in a third mode when the temperature information indicates a temperature higher than or equal to the second temperature.

In the first mode, the first period may be a fixed time period. In the second mode, the second period may be a variable time period. In the third mode, the memory controller may be configured to obtain the temperature information from the temperature sensor according to a third period. The third period may be a fixed time period.

In the first mode, the first operating speed may be a fixed operating speed. In the second mode, the memory controller may be configured to operate at a second operating speed. The second operating speed may be variable and the second operating speed may be lower than the first operating speed. In a third mode, the memory controller may be configured to operate at a third operating speed. The third operating speed may be fixed and the third operating speed may be lower than the second operating speed.

In the second mode, the memory controller may be configured to adjust the second period based on the temperature information.

In the second mode, the memory controller may be configured to decrease the second period as a temperature corresponding to the temperature information increases and to increase the second period as the temperature corresponding to the temperature information decreases.

In the second mode, the memory controller may be configured to adjust an operating speed of the memory controller based on the temperature information.

In the second mode, the memory controller may be configured to decrease an operating speed of the memory controller as a temperature corresponding to the temperature information increases and to increase the operating speed of the memory controller as the temperature corresponding to the temperature information decreases.

In the second mode, the memory controller may be configured to calculate a difference between a previously detected temperature and a currently detected temperature and to adjust at least one of the second period or an operating speed of the memory controller based on the calculated difference.

In the second mode, the memory controller may be configured to increase or decrease at least one of the second period or an operating speed of the memory controller in a binary manner, based on whether a temperature corresponding to the temperature information increases or decreases.

In the second mode, the memory controller may be configured to adjust an operating speed of the memory controller based on the temperature information to maintain a temperature corresponding to the temperature information.

The nonvolatile memory may include cell strings arranged on a substrate. Each of the cell strings may include at least one selection transistor and memory cells stacked in a direction perpendicular to the substrate.

The at least one selection transistor and the memory cells may be charge trap type transistors.

Exemplary embodiments of the present inventive concept provide an operating method of a storage device which includes a nonvolatile memory, a temperature sensor and a memory controller connected to the nonvolatile memory. The operating method includes detecting a temperature using a temperature sensor according to a first period. The operating method includes detecting, when the detected temperature is higher than or equal to a first temperature, a second temperature using the temperature sensor according to a second period. The second period is shorter than the first period. The operating method includes adjusting an operating speed of the memory controller based on the second temperature.

BRIEF DESCRIPTION OF THE FIGURES

The above and other features of the present inventive concept will become more apparent by describing in detail exemplary embodiments thereof, with reference to the accompanying drawings in which.

DETAILED DESCRIPTION

Figure 1:
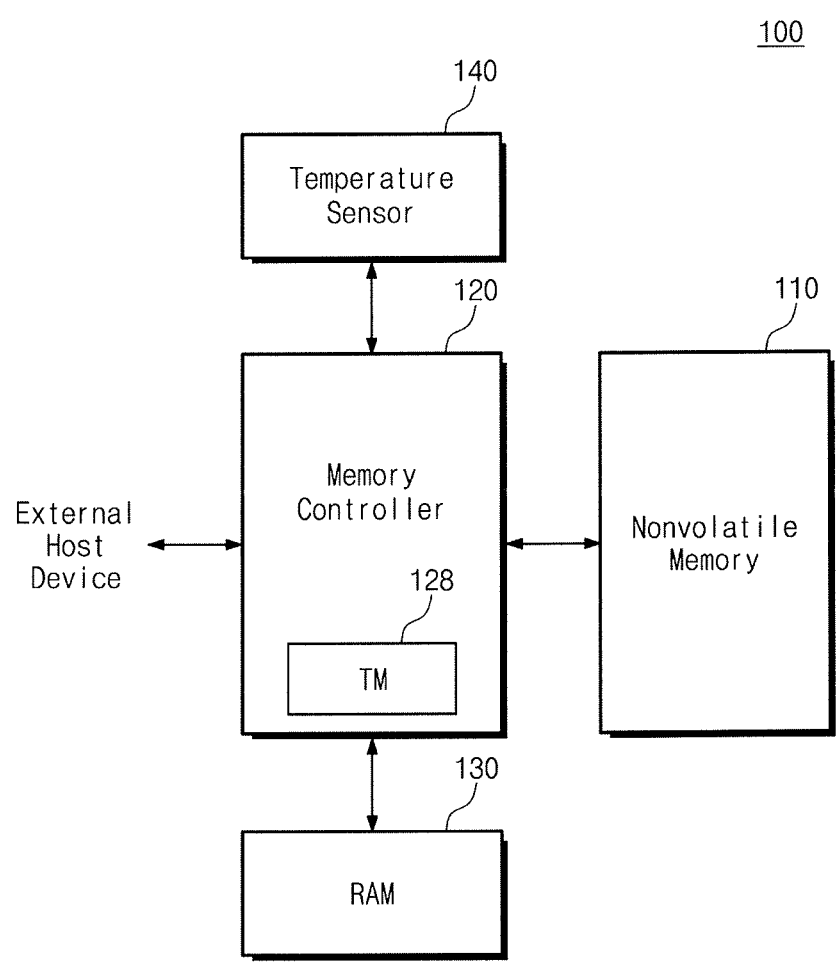
FIG. 1 is a block diagram schematically illustrating a storage device according to an exemplary embodiment of the present inventive concept.

Exemplary embodiments of the present inventive concept will now be described in more detail with reference to the accompanying drawings in which exemplary embodiments are shown. Exemplary embodiments of the present inventive concept may, however, may be embodied in various different forms, and should not be construed as being limited to the exemplary embodiments described herein. Like reference numerals may refer to like elements throughout the specification and drawings. In the drawings, the sizes and relative sizes of layers and regions may be exaggerated for clarity.

It will be understood that, although the terms "first," "second," and "third" may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present inventive concept.

Spatially relative terms, such as "beneath," "below," "lower," "under," "above," or "upper" may be used herein to describe one element or feature's relationship to another element(s) or feature(s) as illustrated in the figures. It will be understood that the spatially relative terms may encompass different orientations of the device in use or operation in addition to the orientation depicted in the figures. It will also be understood that when a layer is referred to as being "between" two layers, it might be the only layer between the two layers, or one or more intervening layers may also be present.

The terminology used herein may be used for the purpose of describing exemplary embodiments of the present inventive concept and is not intended to be limiting to the present inventive concept.

It will be understood that when an element or layer is referred to as being "on," "connected to," "coupled to," or "adjacent to" another element or layer, it may be directly on, connected, coupled, or adjacent to the other element or layer, or intervening elements or layers may be present.

Figure 2:
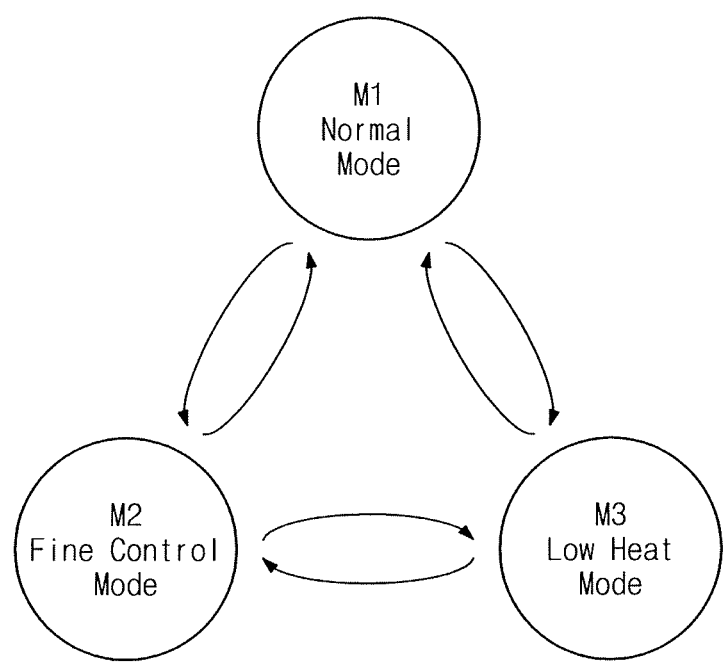
FIG. 2 shows examples of first, second and third modes of a storage device according to exemplary embodiments of the present inventive concept.
Figure 3:
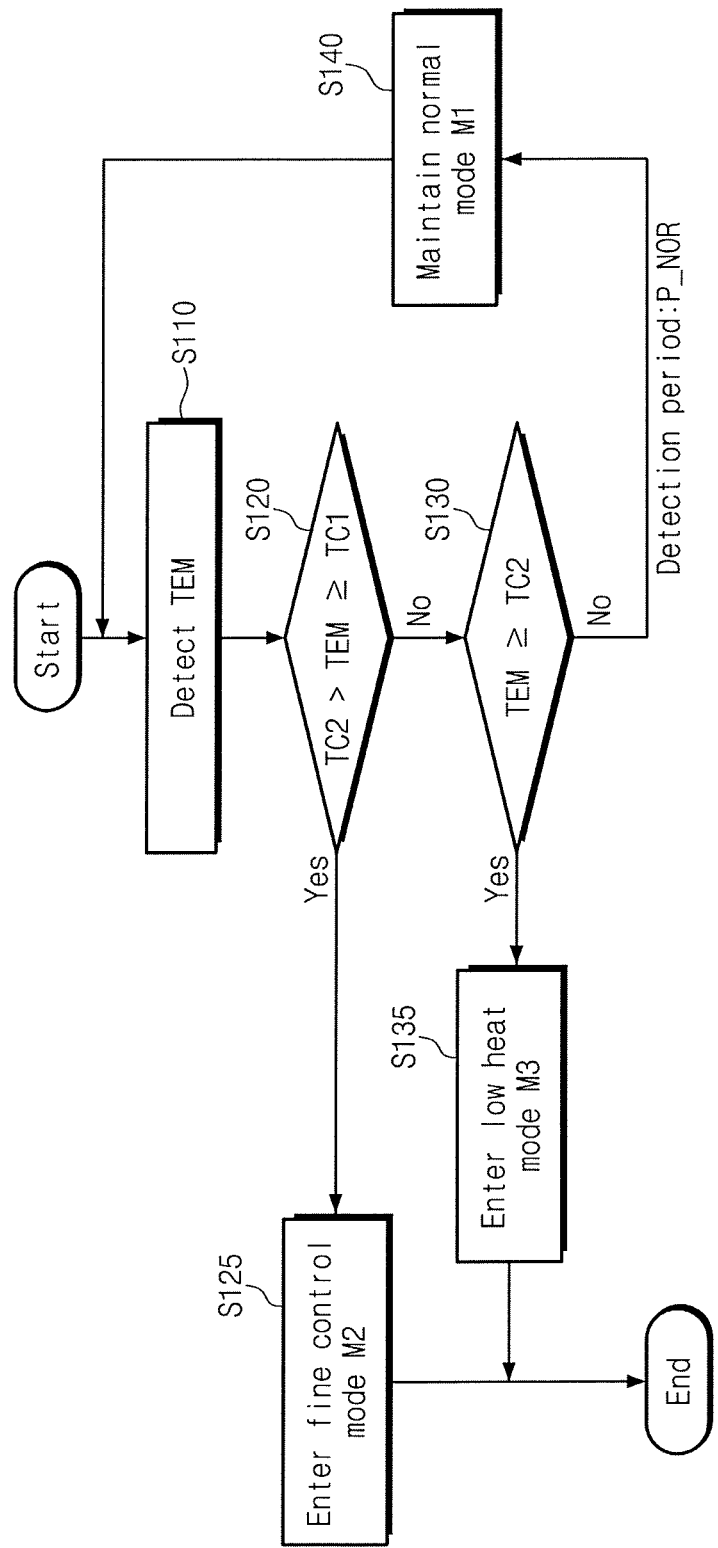
FIG. 3 is a flow chart illustrating an exemplary embodiment of the present inventive concept in which a memory controller operates in a first mode.

FIG. 1 is a block diagram schematically illustrating a storage device according to an exemplary embodiment of the present inventive concept. FIG. 2 shows examples of first, second and third modes of a storage device according to exemplary embodiments of the present inventive concept. FIG. 3 is a flow chart illustrating an exemplary embodiment of the present inventive concept in which a memory controller operates in a first mode.

Referring to FIG. 1, a storage device 100 may include a nonvolatile memory 110, a memory controller 120, a RAM 130, and a temperature sensor 140. The memory controller 120 may include a temperature manager (TM) 128. The temperature manager 128 may control the storage device 100 based on a temperature sensed by the temperature sensor 140.

The temperature sensor 140 may detect a temperature and may output temperature information including the detected temperature. For example, the temperature sensor 140 may output the temperature information to the memory controller 120. The temperature sensor 140 may store the temperature information at the RAM 130. The memory controller 120 or the temperature manager 128 may obtain the temperature information from the temperature sensor 140 or may obtain the temperature information stored at the RAM 130. Based on the temperature information, the memory controller 120 or the temperature manager 128 may signal the storage device 100 or the memory controller 120 to operate in one of a first mode M1, a second mode M2, and a third mode M3. The first, second and third modes M1, M2 and M3 will be described in more detail below with reference to FIG. 2.

Referring to FIGS. 1 and 2, the first mode M1 may be a normal mode. In the first mode M1, the memory controller 120 may obtain temperature information periodically (e.g., at predetermined time points). In the first mode M1, the memory controller 120 may operate at a fixed speed. In the first mode M1, the memory controller 120 may perform an operation requested by a host device or an internally scheduled operation without a delay (e.g., without an intended or artificial delay). The memory controller 120 may operate at a maximum operating speed. The second mode M2 may be a fine control mode. The third mode M3 may be a low heat mode.

The memory controller 120 may operate in the first mode M1 or may operate in the second mode M2 or the third mode M3 based on a temperature of the storage device 100. The memory controller 120 may switch between the first, second and third modes M1, M2 and M3 based on a temperature of the storage device 100. An exemplary embodiment of the present inventive concept in which the memory controller 120 operates in the first mode M1 is illustrated in FIG. 3.

Referring to FIGS. 1 to 3, the memory controller 120 may detect a temperature TEM (S110). The temperature TEM may be detected periodically (e.g., at predetermined times points according to a normal detection period P_NOR). For example, the memory controller 120 may detect the temperature TEM by obtaining temperature information from the temperature sensor 140. In each detection period, if the detected temperature TEM is higher than or equal to a first temperature TC1 and lower than a second temperature TC2 (S120), the memory controller 120 may enter the fine control mode M2 (S125). In each period, if the detected temperature TEM is higher than or equal to the second temperature TC2 (S130), the memory controller 120 may enter the low heat mode M3 (S135). In each detection period, if the detected temperature TEM is lower than the first temperature TC1, the memory controller 120 may maintain the normal mode M1 (S140).

When the storage device 100 is driven by the memory controller 120 in the first mode M1, a temperature of the storage device 100 may rise. If a temperature of the storage device 100 is higher than or equal to the first temperature TC1 and lower than the second temperature TC2, the memory controller 120 may enter the second mode M2, and thus the temperature of the storage device may be controlled.

The second mode M2 may be the fine control mode. In the second mode M2, the memory controller 120 may detect the temperature TEM based on a fine detection period P_FINE (see, e.g., FIGS. 4 and 5). The fine detection period P_FINE may be shorter than the normal period P_NOR used in the first mode M1. The fine period P_FINE may be variable. In the second mode M2, the memory controller 120 may adjust an operating speed based on the detected temperature TEM, and thus the amount of heating of the storage device 100 and the temperature TEM of the storage device 100 may be adjusted. Exemplary embodiments of the present inventive concept in which the memory controller 120 operates in the second mode M2 will be described in more detail below with reference to FIGS. 4 and 5.

Figure 4:
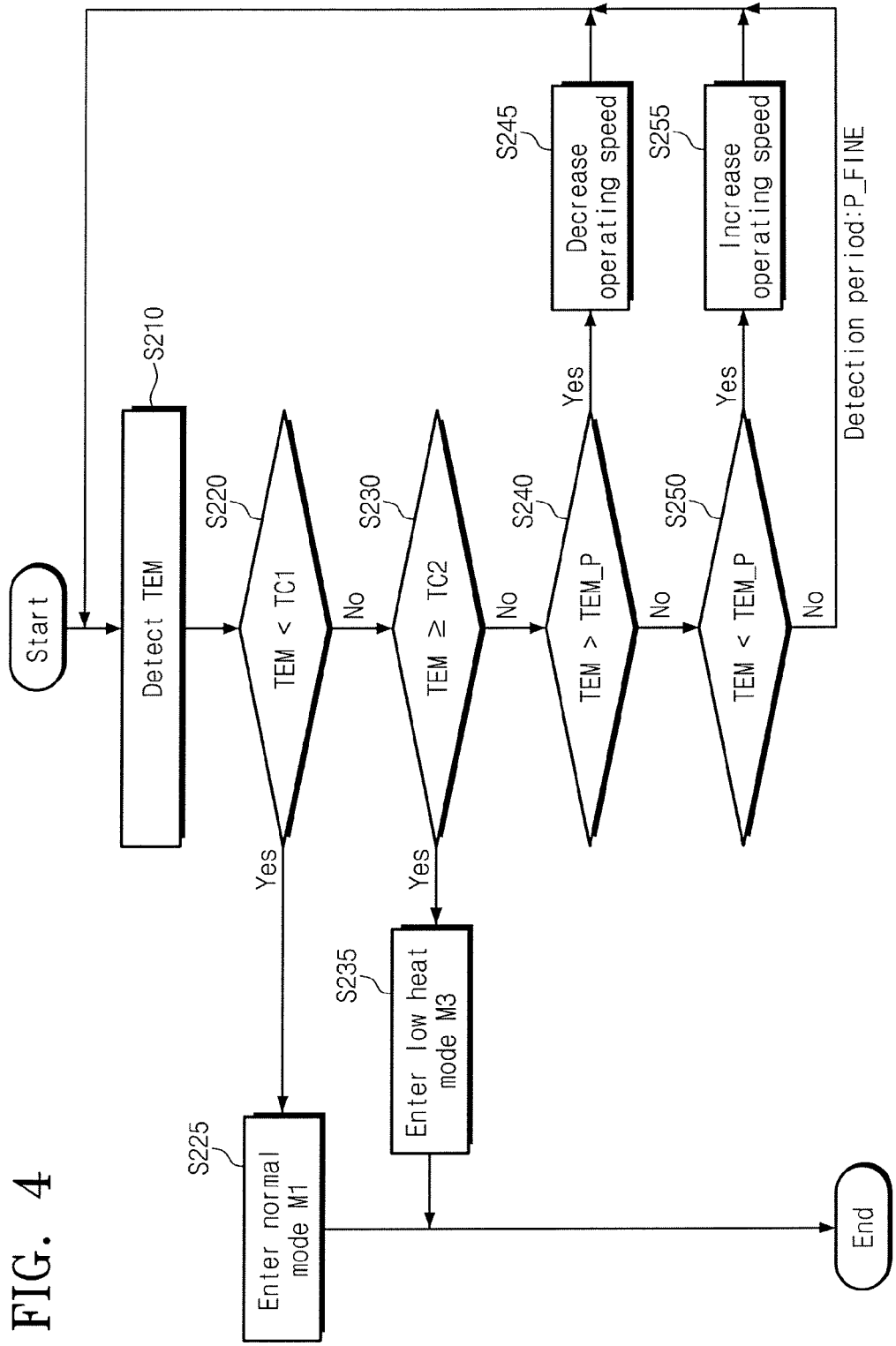
FIGS. 4 and 5 are flow charts illustrating exemplary embodiments of the present inventive concept in which a memory controller operates in a second mode.
Figure 5:
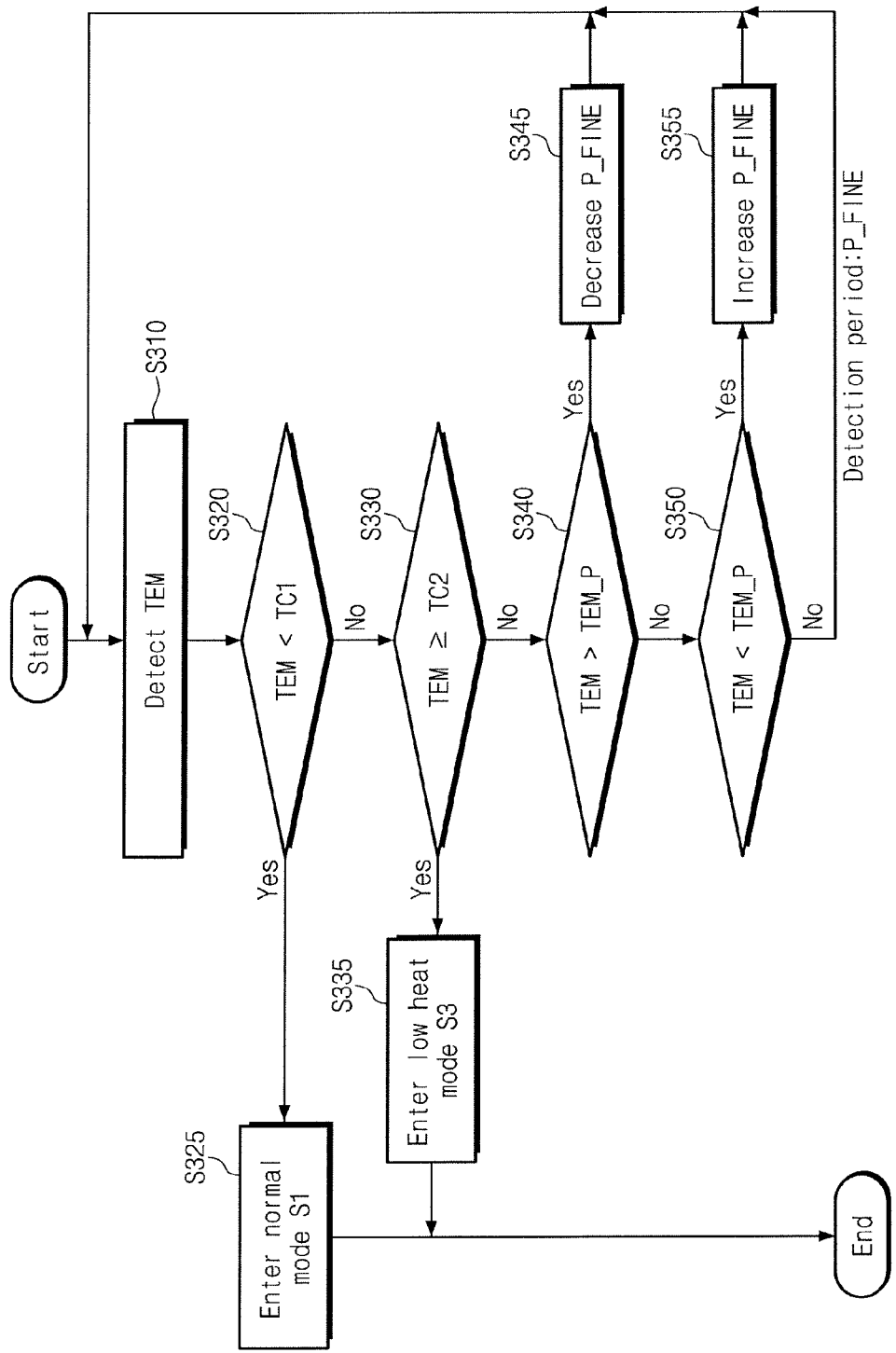

FIGS. 4 and 5 are flow charts illustrating exemplary embodiments of the present inventive concept in which a memory controller operates in a second mode.

Referring to FIGS. 1, 2, and 4, the memory controller 120 may detect a temperature TEM (S210) periodically (e.g., at predetermined times points according to a fine detection period P_FINE). For example, the separation between the predetermined time points of the fine detection period P_FINE may be shorter than the normal detection period P_NOR used in the first mode M1. In the second mode M2, the memory controller 120 may detect the temperature TEM more frequently than in the first mode M1, thus measuring and controlling a temperature variation of the storage device 100 more finely than in the first mode M1.

In each period, if the temperature TEM is lower than the first temperature TC1 (S220), the memory controller 120 may enter the normal mode M1 (S225). In each period, if the temperature TEM is higher than or equal to the second temperature TC2 (S230), the memory controller 120 may enter the low heat mode M3 (S235).

In each period, the memory controller 120 may compare a currently detected temperature TEM with a previously detected temperature TEM_P. The currently detected temperature TEM may be the most recently detected temperature TEM. The previously detected temperature TEM_P may be a temperature detected just before the currently detected temperature TEM. If the currently detected temperature TEM is higher than the previously detected temperature TEM_P (S240), the memory controller 120 may decrease an operating speed of the storage device 100 (S245). For example, the memory controller 120 may decrease the operating speed by (e.g., intentionally or artificially) delaying timing when a response to a request from a host device is sent, delaying a time interval between accessing nonvolatile memory 110, or reducing the number of portions of the nonvolatile memory 110 accessed at the same time. As the operating speed decreases, the amount of heating of the storage device 100 may be lowered, thus reducing the temperature TEM of the storage device 100.

In each period, if the currently detected temperature TEM is lower than the previously detected temperature TEM_P (S250), the memory controller 120 may raise the operating speed. For example, the memory controller 120 may raise the operating speed by reducing delay (e.g., intended or artificial delay) of timing when a response to a request from a host device is sent, decreasing delay (e.g., intended or artificial) of a time interval between accessing the nonvolatile memory 110, or increasing the number of portions of the nonvolatile memory 110 accessed at the same time (e.g., restoration).

If the currently detected temperature TEM is not higher than or less than the previously detected temperature TEM_P, that is, if the currently detected temperature TEM is equal to the previously detected temperature TEM_P, the memory controller 120 may maintain the operating speed without modification.

According to an exemplary embodiment of the present inventive concept, the memory controller 120 may operate at an optimal operating speed not causing a temperature increase. Thus, it may be possible to reduce or prevent the storage device 100 from being damaged due to an increase in the temperature TEM and to reduce or prevent excessively reducing the operating speed of the storage device 100 to reduce heating of the storage device 100.

An exemplary embodiment of the present inventive concept in which the memory controller 120 operates in the second mode M2 is illustrated in FIG. 5. Referring to FIGS. 1, 2, and 5, the memory controller 120 may detect the temperature TEM (S310) periodically (e.g., at predetermined times points according to the variable fine detection period P_FINE). In each period, if the temperature TEM is lower than the first temperature TC1 (S320), the memory controller 120 may enter the first mode M1 (S325). In each period, if the temperature TEM is higher than or equal to the second temperature TC2 (S330), the memory controller 120 may enter the low heat mode M3 (S335).

In each period, the memory controller 120 may compare the currently detected temperature TEM with the previously detected temperature TEM_P. If the currently detected temperature TEM is higher than the previously detected temperature TEM_P (S340), the memory controller 120 may decrease the fine detection period P_FINE (S345). If the fine detection period P_FINE becomes shorter, the memory controller 120 may detect the temperature TEM more frequently, thus controlling the temperature TEM more finely.

In each period, if the currently detected temperature TEM is lower than the previously detected temperature TEM_P (S350), the memory controller 120 may increase the fine detection period P_FINE. If the fine detection period P_FINE is increased, a resource or overhead of the memory controller 120 used to detect the temperature TEM may be reduced.

If the currently detected temperature TEM is not higher than or less than the previously detected temperature TEM_P, that is, if the currently detected temperature TEM is equal to the previously detected temperature TEM_P, the memory controller 120 may maintain the fine detection period P_FINE without modification.

In exemplary embodiments of the present inventive concept, the operation of FIG. 4 and the operation of FIG. 5 may be combined. For example, the memory controller 120 may detect the temperature TEM (S210 and S310) periodically (e.g., at predetermined times points according to the variable fine detection period P_FINE). If the temperature TEM is lower than the first temperature TC1 (S220 and S320), the memory controller 120 may enter the normal mode M1 (S225 and S325). If the temperature TEM is higher than the second temperature TC2 (S230 and S330), the memory controller 120 may enter the low heat mode M3 (S235 and S335). In each period, if a currently detected temperature TEM is higher than a previously detected temperature TEM_P (S240 and S340), the memory controller 120 may decrease an operating speed and may decrease the fine detection period P_FINE (S245 and S345). In each period, if the currently detected temperature TEM is lower than the previously detected temperature TEM_P (S250 and S350), the memory controller 120 may increase the operating speed and may increase the fine detection period P_FINE (S245 and S345).

That is, in the second mode M2, the operating speed and the fine detection period P_FINE of the memory controller 120 may be varied according to the temperature TEM. The fine detection period P_FINE of the second mode M2 may be shorter than the normal detection period P_NOR of the first mode M1. The operating speed of the second mode M2 may be lower than that of the normal mode M1.

Referring to FIGS. 2 to 5, if the temperature TEM is higher than or equal to the second temperature TC2, the memory controller 120 may enter the third mode M3. The third mode M3 may be a low heat mode. In the third mode M3, the memory controller 120 may minimize the amount of heating of the storage device 100. For example, the memory controller 120 may minimize the amount of heating of the storage device 100 by setting a timing delay for when a response to a request from a host device is sent, delay of a time interval between accessing the nonvolatile memory 110, or the number of simultaneously accessed portions of the nonvolatile memory 110 to a minimum value. The memory controller 120 may adjust the operating speed of the storage device 100 not to violate timeout constraints set by a host device.

In the third mode M3, the memory controller 120 may have a fixed operating speed. The operating speed of the third mode M3 may be lower than those of the first and second modes M1 and M2. In exemplary embodiments of the present inventive concept, the operating speed of the third mode M3 may be a minimum speed that does not cause a timeout with respect to a request from an external host device.

In the third mode M3, the memory controller 120 may detect the temperature TEM periodically (at predetermined times points). For example, a detection period of the third mode M3 may be shorter than, longer than, or equal to the normal detection period P_NOR of the first mode M1. For example, the detection period of the third mode M3 may be shorter than, longer than, or equal to the fine detection period P_FINE of the second mode M2.

In the third mode M3, if the temperature TEM decreases into a range higher than or equal to the first temperature TC1 and lower than the second temperature TC2, the memory controller 120 may enter the second mode M2. In the third mode M3, if the temperature TEM is decreased into a range lower than the first temperature TC1, the memory controller 120 may enter the first mode M1.

According to exemplary embodiments of the present inventive concept, when the temperature TEM is lower than the first temperature TC1, the storage device 100 or the memory controller 120 may operate in the first mode M1. In the first mode M1, the memory controller 120 need not perform an operation for managing the temperature TEM. Accordingly, the overhead of the storage device 100 and/or the memory controller 120 may be reduced, and thus the operating speed of the storage device 100 and/or the memory controller 120 may be increased.

When the temperature TEM is higher than or equal to the first temperature TC1 and lower than the second temperature TC2, the storage device 100 or the memory controller 120 may operate in the second mode M2. In the second mode M2, the memory controller 120 may adjust the operating speed of the memory controller 120 or the fine detection period P_FINE, based on the temperature TEM. That is, the storage device 100 and/or the memory controller 120 may operate in an optimal operating speed which may reduce or prevent an increase in the temperature TEM, thus operating the operating speed of the storage device 100 and/or the memory controller 120.

When the temperature TEM is higher than or equal to the second temperature TC2, the storage device 100 or the memory controller 120 may operate in the third mode M3. In the third mode M3, the memory controller 120 may minimize the operating speed of the storage device 100 or the memory controller 120 such that the amount of heating of the storage device 100 is minimized. Thus, damage to the storage device 100 from overheating may be reduced or prevented.

Figure 6:
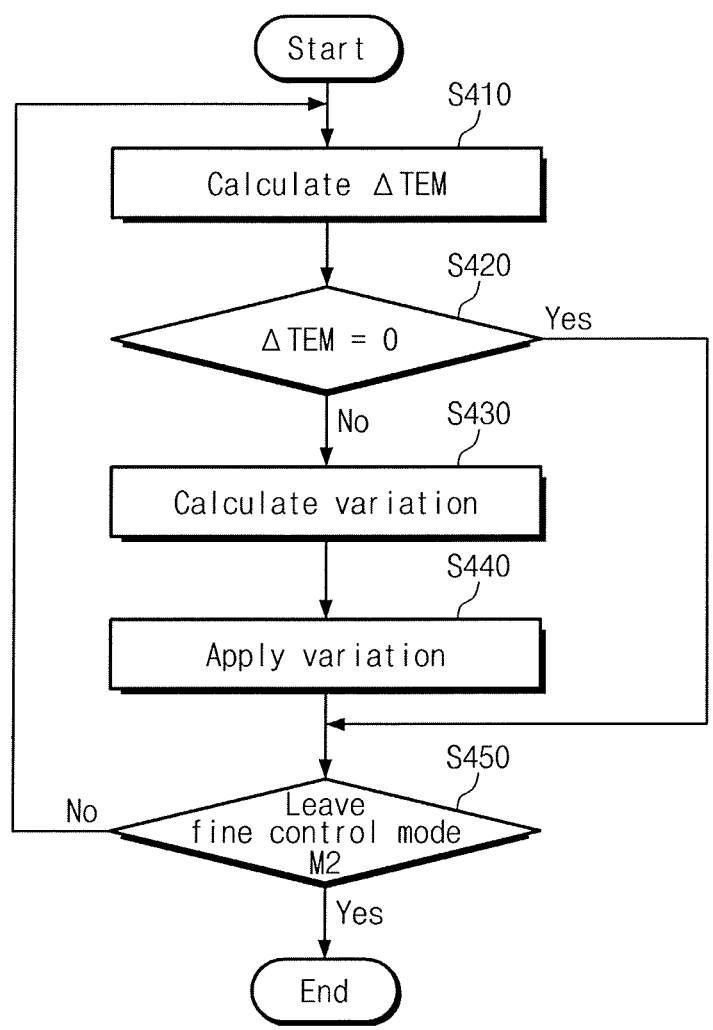
FIGS. 6 to 8 are flow charts illustrating exemplary embodiments of the present inventive concept in which a memory controller decides a variation in an operating speed or a fine period in a second mode.
Figure 7:
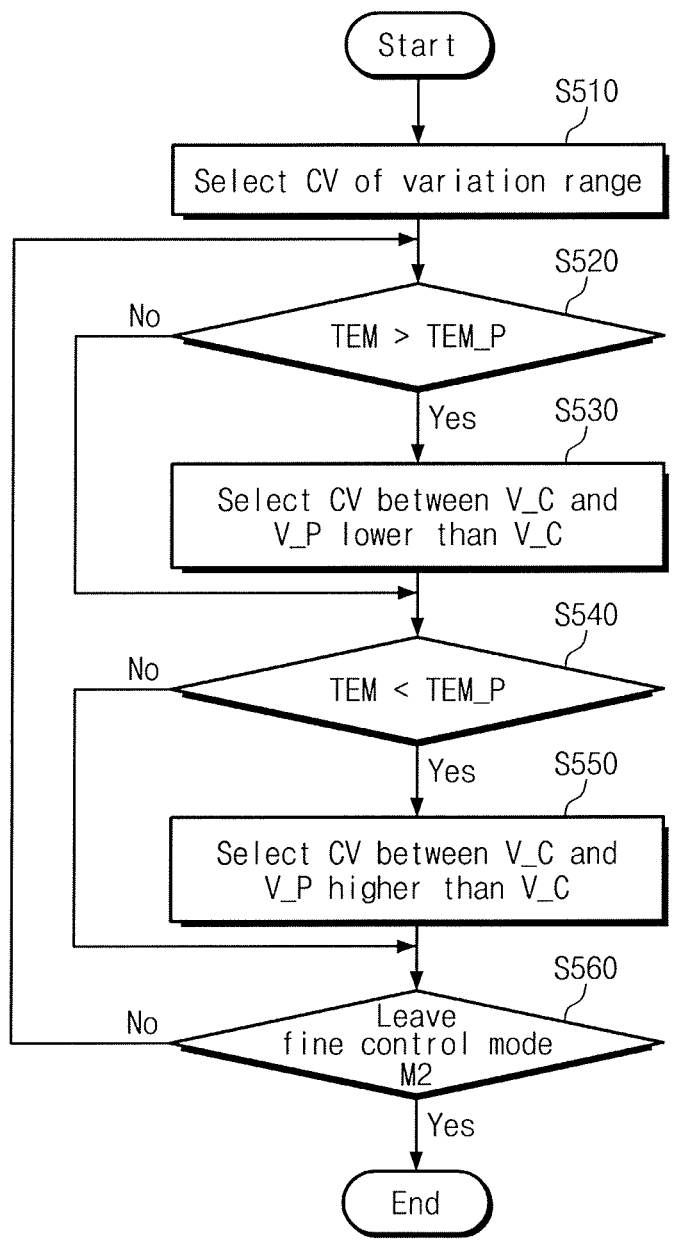
Figure 8:
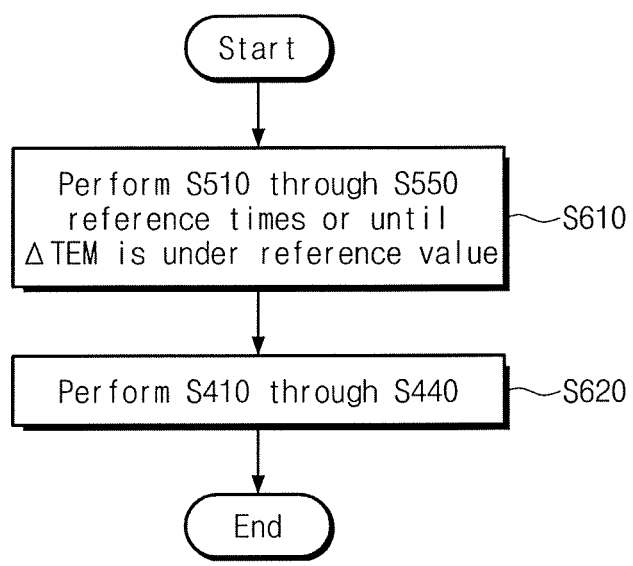

FIGS. 6 to 8 are flow charts illustrating exemplary embodiments of the present inventive concept in which a memory controller decides a variation in an operating speed or a fine detection period in a second mode. Referring to FIGS. 1 and 6, the memory controller 120 may calculate a temperature difference ΔTEM (S410) between the currently detected temperature TEM and the previously detected temperature TEM_P. If no difference is detected between the currently detected temperature TEM and the previously detected temperature TEM_P (S420), the memory controller 1200 need not calculate a variation in an operating speed or a fine detection period P_FINE. If a temperature difference ΔTEM is detected between the currently detected temperature TEM and the previously detected temperature TEM_P (S420), the memory controller 1200 may calculate a variation in an operating speed or the fine detection period P_FINE, based on the temperature difference ΔTEM (S430).

The memory controller 120 may store a variation in the operating speed or the fine detection period P_FINE according to a range of temperature differences ΔTEM. The variation in the operating speed or the fine detection period P_FINE according to a range of temperature differences ΔTEM may be stored in the form of table. Based on the stored table, the memory controller 120 may calculate the variation in the operating speed or fine period P_FINE. Alternatively, the memory controller 120 may include an algorithm for calculating the variation in the operating speed or the fine detection period P_FINE based on the temperature difference ΔTEM. Based on the algorithm, the memory controller 120 may calculate the variation in the operating speed or the fine detection period P_FINE based on the temperature difference ΔTEM.

In exemplary embodiments of the present inventive concept, as the temperature difference ΔTEM increases, the operating speed or the fine detection period P_FINE may increase. As the temperature difference ΔTEM decreases, the operating speed or the fine detection period P_FINE may decrease.

The memory controller 120 may apply the decided variation (S440). For example, the memory controller 120 may adjust the operating speed or the fine detection period P_FINE based on the decided variation.

An operation of calculating the variation in the operating speed or the fine detection period P_FINE may be performed for every temperature detection period while the memory controller 120 operates in the second mode M2 or until the memory controller 120 is switched out of the second control mode M2.

FIG. 7 shows another exemplary embodiment of the present inventive concept in which the memory controller 120 determines a variation in the operating speed or the fine detection period P_FINE. Referring to FIGS. 1 and 7, the memory controller 120 may determine the variation in the operating speed or the fine detection period P_FINE based on binary search algorithm.

When entering the second mode M2, the memory controller 120 may select a center value CV of a variation range (S510) of the operating speed or the fine detection period P_FINE as the operating speed or the fine detection period P-FINE. The memory controller 120 may adjust the operating speed or the fine period P_FINE based on the selected center value CV.

In a later period where the temperature TEM is determined, the memory controller 120 may compare the currently detected temperature TEM and the previously detected temperature TEM_P. If the currently detected temperature TEM is higher than the previously detected temperature TEM_P (S520), the memory controller 120 may select a center value CV between a current variation V_C and a previous variation V_P lower than the current variation V_C (S530). For example, the current variation V_C may be a variation most recently used to adjust the operating speed or the fine detection period P_FINE. The previous variation V_P may be a variation that was used to adjust the operating speed or the fine detection period P_FINE prior to the current variation V_C, lower than the current variation V_C. In a case where the current variation V_C is a first selected variation, a boundary value lower than the current variation V_C may be selected as the previous variation V_P.

If the current temperature TEM is lower than the previous temperature TEM_P (S540), the memory controller 120 may select a center value CV between the current variation V_C and the previous variation V_P higher than the current variation V_C (S550). For example, the current variation V_C may be a variation used to adjust the operating speed or the fine detection period P_FINE most recently. The previous variation V_P may be a variation that was used to adjust the operating speed or the fine period P_FINE prior to the current variation V_C, greater than the current variation V_C. In the case where the current variation V_C is the firstly selected variation, a boundary value higher than the current variation V_C may be selected as the previous variation V_P.

The memory controller 120 may adjust the operating speed or the fine detection period P_FINE, based on the selected center value CV.

An operation of calculating the variation in the operating speed or the fine detection period P_FINE based on binary search algorithm may be performed every temperature detection period while the memory controller 120 operates in the second mode M2, thus determining whether the memory controller 120 will leave the fine control mode M2 (S560). The operation of calculating the variation in the operating speed or the fine detection period P_FINE based on binary search algorithm may be performed every temperature detection period until the memory controller 120 leaves the second control mode M2.

The variation range of the fine detection period P_FINE according to an exemplary embodiment of the present inventive concept may be from about −0.05 seconds to 0 seconds. When entering the second mode M2, the memory controller 120 may select −0.25 seconds as a center value CV of the variation range. For example, the fine detection period P_FINE may be adjusted by −0.25 seconds. When the temperature TEM increases in a later period, the memory controller 120 may select −0.375 seconds as the center value CV. When the temperature TEM decreases in a later period, the memory controller 120 may select −0.125 seconds being the center value CV.

FIG. 8 shows another exemplary embodiment of the present inventive concept in which the memory controller 120 determines the variation in the operating speed or the fine detection period P_FINE. Referring to FIGS. 1 and 8, the memory controller 120 may determine the variation in the operating speed or the fine detection period P_FINE, based on a combination of the methods of using the table and the algorithm.

When entering the second mode M2, the memory controller 120 may determine the variation of the operating speed or the fine detection period P_FINE, based on the binary search algorithm described herein. Steps S510 through S550 may be performed a predetermined number of times (e.g., a reference number of times) or until ΔTEM is under a reference value (S610). For example, the memory controller 120 may determine, according to steps S510 to S550, a variation in the operating speed or the fine detection period P_FINE during the number of reference times or until a temperature difference ΔTEM between the currently detected temperature TEM and the previously detected temperature TEM_P is lower than the reference value. After performing steps S510 through S550, the memory controller 120 may perform steps S410 through S440 (S620).

The memory controller 120 may determine a variation in the operating speed or the fine detection period P_FINE based on the table of the temperature differences ΔTEM described herein.

Returning to FIG. 1, the nonvolatile memory 110 may perform read, write and erase operations in response to a signal provided by the memory controller 120. The nonvolatile memory 110 may receive a command and an address from the memory controller 120 through an input/output channel. The nonvolatile memory 110 may exchange data with the memory controller 120.

The nonvolatile memory 110 may exchange a control signal with the memory controller 120 through a control channel. For example, the nonvolatile memory 110 may receive, from the memory controller 120, a chip enable signal /CE for selecting at least one of a plurality of semiconductor chips of the nonvolatile memory 110, a command latch enable signal CLE indicating that a signal received from the memory controller 120 through the input/output channel is a command, an address latch enable signal ALE indicating that a signal received from the memory controller 120 through the input/output channel is an address, a read enable signal /RE that the memory controller 120 generates at a read operation, is periodically toggled, and is used to tune timing, a write enable signal /WE activated by the memory controller 120 when the command or the address is transmitted, a write protection signal /WP activated by the memory controller 120 to prevent unintended writing or erasing when a power changes, and a data strobe signal DQS that the memory controller 120 generates in a write operation, is periodically toggled, and is used to adjust input synchronization of data transmitted through the input/output channel. For example, the nonvolatile memory 110 may output, to the memory controller 120, a ready/busy signal R/nB indicating whether the nonvolatile memory 110 is performing a program, erase or read operation and a data strobe signal DQS that the nonvolatile memory 110 generates based on the read enable signal /RE, is periodically toggled, and is used to adjust output synchronization of data.

The nonvolatile memory 110 may include a flash memory. However, exemplary embodiments of the present inventive concept are not limited thereto. For example, the nonvolatile memory 110 may incorporate at least one of nonvolatile memories, such as a PRAM, an MRAM, a RRAM, and a FeRAM.

The memory controller 120 may be configured to control the nonvolatile memory 110. For example, the nonvolatile memory 110 may control the nonvolatile memory 110 through the input/output and control channels to perform a write, read, or erase operation.

The memory controller 120 may control the nonvolatile memory in response to a control signal from an external host device. In exemplary embodiments of the present inventive concept, the memory controller 120 may communicate with the external host device in compliance with a format different from a format for communication with the nonvolatile memory 110. A data unit by which the memory controller 120 communicates with the nonvolatile memory 110 may be different from that by which it communicates with the external host device.

The memory controller 120 may use the RAM 130 as a working memory, a buffer memory, or a cache memory. For example, the memory controller 120 may store data or codes for managing the nonvolatile memory 110 at the RAM 130. For example, the memory controller 120 may read data or codes for managing the nonvolatile memory 110 from the nonvolatile memory 110 and may load and drive it on the RAM 130.

The RAM 130 may include at least one of a variety of random access memories, such as, but not limited to, a SRAM, a DRAM, a synchronous DRAM (SDRAM), a PRAM, a MRAM, a RRAM, and a FRAM.

The storage device 100 may include a solid state drive (SSD) or a hard disk drive (HDD). The storage device 100 may include the following memory cards: PC card (PCM-CIA, personal computer memory card international association), compact flash card, smart media card (SM, SMC), memory stick, multimedia card (MMC, RS-MMC, MMC-micro), SD card (SD, miniSD, microSD, SDHC), USB (Universal Serial Bus) memory card, and/or universal flash storage (UFS). The storage device 100 may include the following embedded memories: eMMC (embedded Multi-Media Card), UFS, and/or PPN (Perfect Page New).

Referring to FIG. 1, the temperature sensor 140 may be disposed independently from the nonvolatile memory 110, the memory controller 120, and the RAM 130. However, the temperature sensor 140 may be disposed within the nonvolatile memory 110, the memory controller 120, or the RAM 130.

Referring to FIG. 1, the storage device 100 may include the RAM 130 disposed outside the memory controller 120. However, the storage device 100 might not include the RAM 130 disposed outside the memory controller 120. The memory controller 120 may include an internal RAM (see, e.g., FIG. 9) as a buffer memory, a working memory, or a cache memory.

Figure 9:
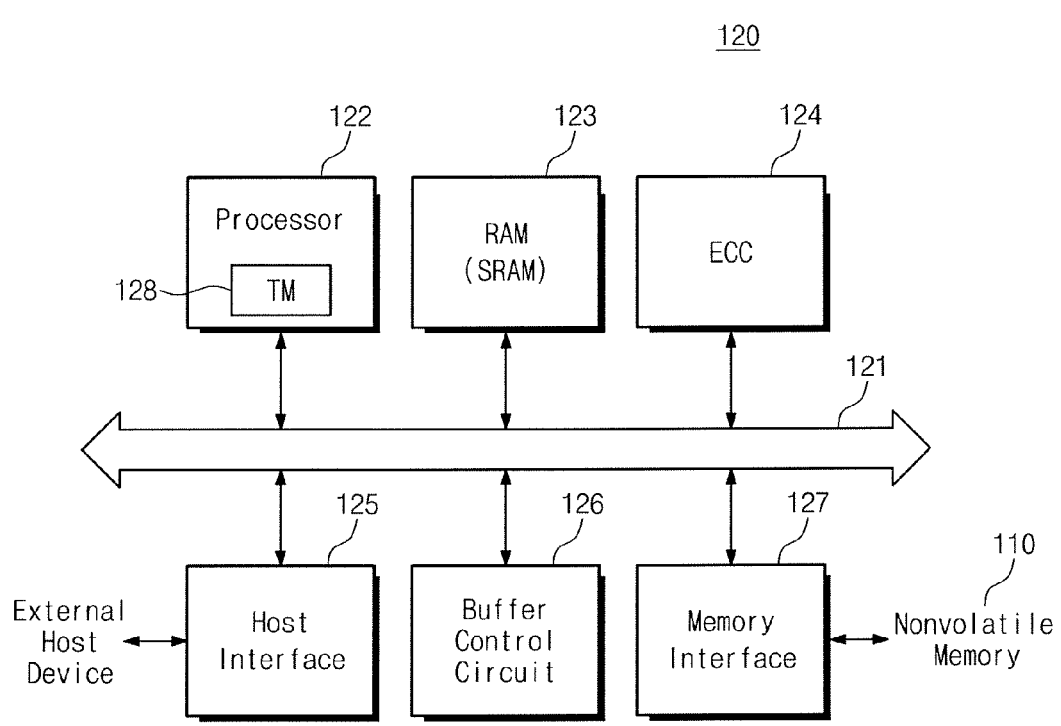
FIG. 9 is a block diagram schematically illustrating a memory controller according to an exemplary embodiment of the present inventive concept.

FIG. 9 is a block diagram schematically illustrating a memory controller according to an exemplary embodiment of the present inventive concept. Referring to FIG. 9, the memory controller 120 may include a bus 121, a processor 122, a RAM 123 (e.g., an SRAM), an ECC block 124, a host interface 125, a buffer control circuit 126, and a memory interface 127.

The bus 121 may provide a channel between components of the memory controller 120.

The processor 122 may control an overall operation of the memory controller 120 and may execute a logical operation. The processor 122 may communicate with the external host device through the host interface 125 and may communicate with the RAM 130 through the buffer control circuit 126. The processor 122 may control the storage device 100 to use the RAM 123 as a working memory, a cache memory, or a buffer memory.

The processor 122 may include the temperature manager 128. The temperature manager 128 may include software driven by the processor 122 or hardware components included in the processor 122. The temperature manager 128 may include a combination of software driven by the processor 122 or hardware components included in the processor 122.

The RAM 123 may be used as a working memory, a cache memory, or a buffer memory of the processor 122. The RAM 123 may store codes or instructions that the processor 122 may execute. The RAM 123 may store data processed by the processor 122. The RAM 123 may include an SRAM.

The ECC block 124 may perform an error correction operation. The ECC block 124 may perform error correction encoding, based on data to be written at the nonvolatile memory 110 through the memory interface 127. The encoded data may be transferred to the nonvolatile memory 110 through the memory interface 127. The ECC block 124 may perform error correction decoding on data received from the nonvolatile memory 110 through the memory interface 127. In exemplary embodiments of the present inventive concept, the ECC block 124 may be included in the memory interface 127 as a component of the memory interface 127.

The host interface 125 may communicate with the external host device 100 in response to a control of the processor 122. The host interface 125 may communicate using at least one of various communication manners, such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The buffer control circuit 126 may control the RAM 123 in response to a control of the processor 122.

The memory interface 127 may communicate with the nonvolatile memory 110 in response to a control of the processor 122. The memory interface 127 may send a first command and an address to the nonvolatile memory 110 through an input/output channel and may exchange a control signal with the nonvolatile memory 110 through a control channel.

In exemplary embodiments of the present inventive concept, in the case where the storage device 100 does not include the RAM 130, the memory controller 120 need not include the buffer control circuit 126.

In exemplary embodiments of the present inventive concept, the processor 122 may control the memory controller 120 using codes. The processor 122 may load codes from a nonvolatile memory (e.g., read only memory) that may be included in the memory controller 120. Alternatively, the processor 122 may load codes received from the nonvolatile memory 110 through the memory interface 127.

In exemplary embodiments of the present inventive concept, the bus 121 of the memory controller 120 may be divided into a control bus and a data bus. The data bus may transfer data to the memory controller 120, and the control bus may transfer the control information such as a command and an address, to the memory controller 120. The data bus and the control bus may be separated to prevent mutual interference or influence. The data bus may be connected with the ECC block 124, the host interface 125, the buffer control circuit 126, and the memory interface 127. The control bus may be connected with the processor 122, the RAM 123, the host interface 125, the buffer control circuit 126, and the memory interface 127.

Figure 10:
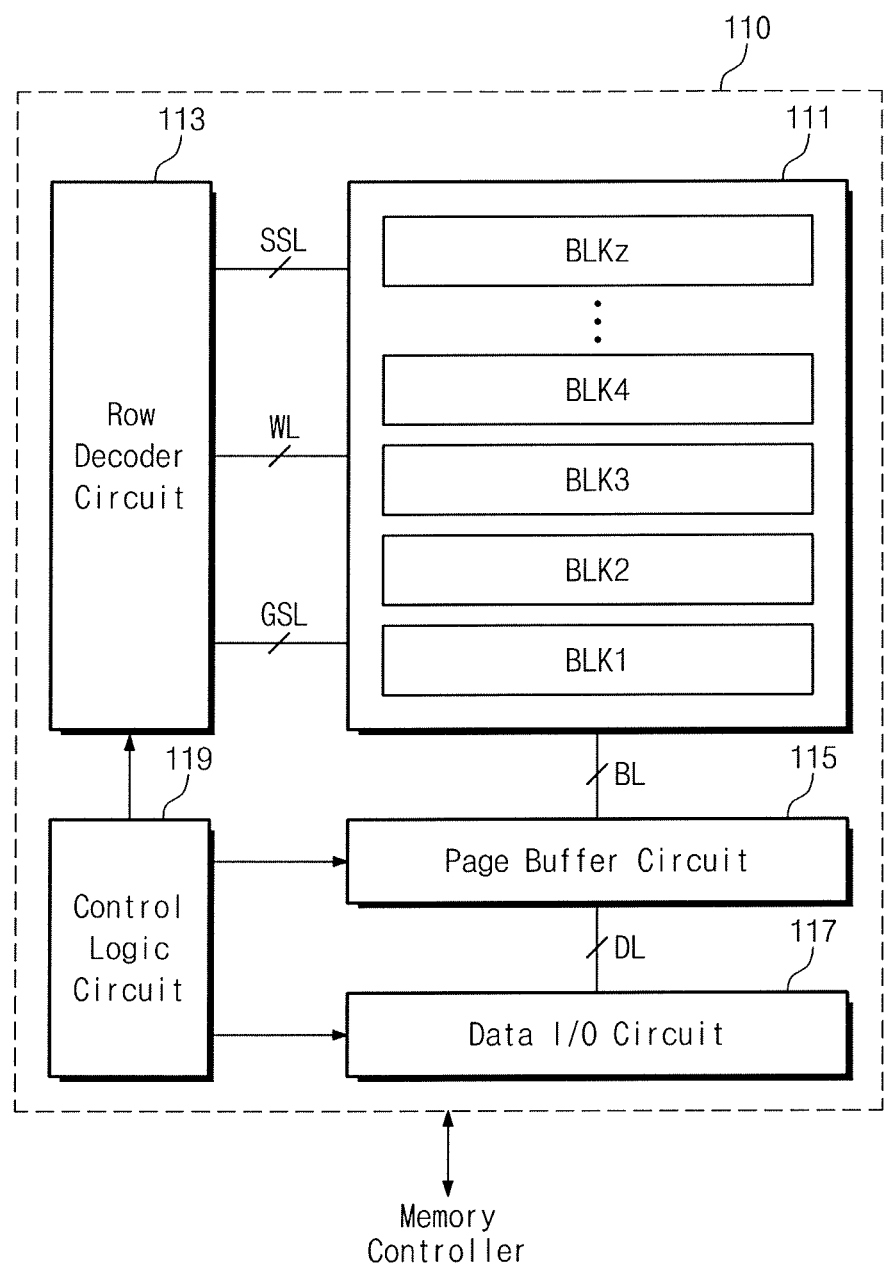
FIG. 10 is a block diagram schematically illustrating a nonvolatile memory according to an exemplary embodiment of the present inventive concept.

FIG. 10 is a block diagram schematically illustrating a nonvolatile memory according to an exemplary embodiment of the present inventive concept. Referring to FIG. 10, the nonvolatile memory 110 may include a memory cell array 111, a row decoder circuit 113, a page buffer circuit 115, a data input/output circuit 117, and a control logic circuit 119.

The memory cell array 111 may include a plurality of memory blocks BLK1 through BLKz, each of which may include a plurality of memory cells. Each memory block may be connected to the row decoder circuit 113 through at least one string selection line SSL, a plurality of word lines WL, and at least one ground selection line GSL. Each memory block may be connected to the page buffer circuit 115 through a plurality of bit lines BL. The plurality of memory blocks BLK1 through BLKz may be connected in common to the plurality of bit lines BL. Memory cells of each of the plurality of memory blocks BLK1 through BLKz may have the same structure. In exemplary embodiments of the present inventive concept, each of the plurality of memory blocks BLK1 through BLKz may be an erase unit. An erase operation may be carried out by each of the memory blocks. Memory cells of each of the memory blocks may be erased at substantially the same time. In other exemplary embodiments of the present inventive concept, each memory block may be divided into a plurality of sub blocks. Each sub block may be an erase unit.

The row decoder circuit 113 may be connected to the memory cell array 111 through a plurality of ground selection lines GSL, the plurality of word lines WL, and a plurality of string selection lines SSL. The row decoder circuit 113 may operate in response to a control of the control logic circuit 119. The row decoder circuit 113 may decode an address received from the memory controller 120 through an input/output channel and may control voltages to be applied to the word lines WL based on the decoded address.

The row decoder circuit 113 may apply a program voltage to a selected word line of a memory block selected by an address. The row decoder circuit 113 may also apply a pass voltage to unselected word lines of the selected memory block. At reading, the row decoder circuit 113 may apply a selection read voltage to a selected word line of a memory block selected by an address. The row decoder circuit 113 may also apply a non-selection read voltage to unselected word lines of the selected memory block. At erasing, the row decoder circuit 113 may apply an erase voltage (e.g., a ground voltage or low voltages having a level similar to that of the ground voltage) to word lines of a memory block selected by an address.

The page buffer circuit 115 may be connected to the memory cell array 111 through the bit lines BL. The page buffer circuit 115 may be connected to the data input/output circuit 117 through a plurality of data lines DL. The page buffer circuit 115 may operate in response to a control of the control logic circuit 119.

During a program operation, the page buffer circuit 115 may store data to be stored in memory cells. The page buffer circuit 115 may apply voltages to the bit lines BL based on the stored data. The page buffer circuit 115 may serve as a write driver at a program operation. During a read operation, the page buffer circuit 115 may sense voltages of the bit lines BL and may store the sensed results. The page buffer circuit 115 may serve as a sense amplifier at a read operation.

The data input/output circuit 117 may be connected to the page buffer circuit 115 through the data lines DL. The data input/output circuit 117 may output data, read by the page buffer circuit 115, to the memory controller 120 through the input/output channel. The data input/output circuit 117 may transfer data received from the memory controller 120 through the input/output channel, to the page buffer circuit 115.

The control logic circuit 119 may receive, from the memory controller 120, a command through the input/output channel and a control signal through a control channel. The control logic circuit 119 may receive a command transferred through the input/output channel in response to the control signal, may route the address received through the input/output channel to the row decoder circuit 113, and may route data received through the input/output channel to the data input/output circuit 117. The control logic circuit 119 may decode the received command and may control the nonvolatile memory 110 based on the decoded command.

In exemplary embodiments of the present inventive concept, during a read operation, the control logic circuit 119 may generate a data strobe signal DQS using a read enable signal /RE received from the memory controller 120 through the control channel. The data strobe signal DQS may be output to the memory controller 120 through the control channel. During a write operation, the control logic circuit 119 may receive a data strobe signal DQS from the memory controller 120 through the control channel.

In exemplary embodiments of the present inventive concept, the nonvolatile memory 110 may include a temperature sensor or may receive temperature information from the temperature sensor 140. As described with reference to FIGS. 1 to 8, the control logic circuit 119 may allow the nonvolatile memory 110 to operate in the first mode M1, the second mode M2 or the third mode M3 based on a temperature detected by the temperature sensor 140.

In the first mode, the nonvolatile memory 110 may operate at a fixed full speed without delay under a control of the control logic circuit 119. The control logic circuit 119 may detect a temperature from the temperature sensor 140 periodically at predetermined time points.

In the second mode, under a control of the control logic circuit 119, the nonvolatile memory 110 may operate having a delay (e.g., an intended or artificial delay) varying with a temperature and may operate with a speed varying with the temperature. The control logic circuit 119 may detect a temperature from the temperature sensor 140 periodically or based on a fine detection period varying with the temperature.

In the third mode, the nonvolatile memory 110 may operate at a fixed minimum speed under a control of the control logic circuit 119. For example, the fixed minimum speed may have a maximum delay (e.g., an intended or artificial delay) not causing a timeout. The control logic circuit 119 may detect a temperature from the temperature sensor 140 periodically or at predetermined time points.

Figure 11:
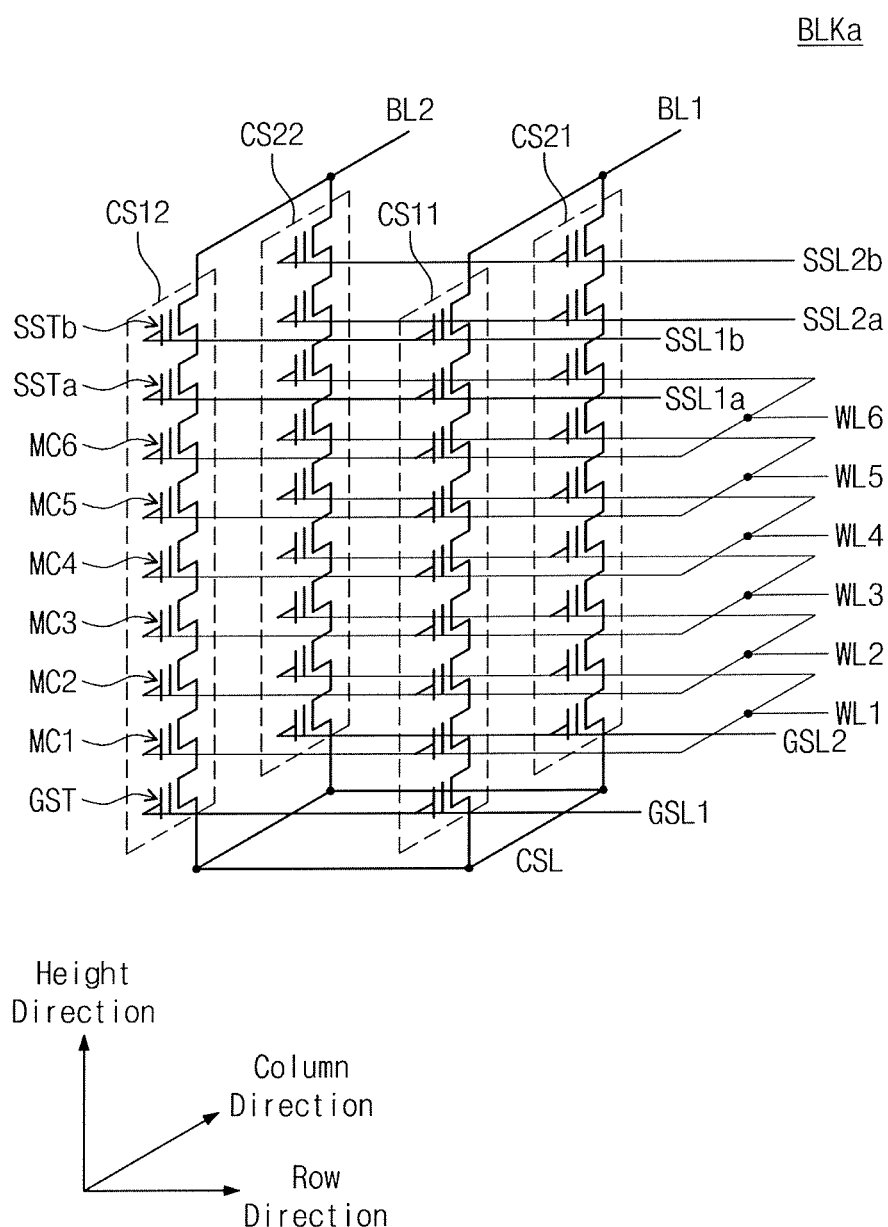
FIG. 11 is a circuit diagram schematically illustrating a memory block according to an exemplary embodiment of the present inventive concept.

FIG. 11 is a circuit diagram schematically illustrating a memory block according to an exemplary embodiment of the present inventive concept. Referring to FIG. 11, a memory block BLKa may include a plurality of cell strings CS11 to CS21 and CS12 to CS22. The plurality of cell strings CS11 to CS21 and CS12 to CS22 may be arranged along a row direction and a column direction and may form rows and columns.

For example, the cell strings CS11 and CS12 arranged along the row direction may form a first row, and the cell strings CS21 and CS22 arranged along the row direction may form a second row. The cell strings CS11 and CS21 arranged along the column direction may form a first column, and the cell strings CS12 and CS22 arranged along the column direction may form a second column.

Each cell string may include a plurality of cell transistors. The cell transistors may include ground selection transistors GST, memory cells MC1 through MC6, and string selection transistors SSTa and SSTb. The ground selection transistors GST, memory cells MC1 through MC6, and string selection transistors SSTa and SSTb of each cell string may be stacked in a height direction perpendicular to a plane (e.g., a plane on a substrate of the memory block BLKa) on which the cell strings CS11 through CS21 and CS12 through CS22 are arranged along rows and columns.

Each cell transistor may include a charge trap type cell transistor of which the threshold voltage varies with the amount of charge trapped in its insulation layer.

Lowermost ground selection transistors GST may be connected in common to a common source line CSL.

Control gates of the ground selection transistors GST of the cell strings CS11 to CS21 and CS12 to CS22 may be connected to ground selection lines GSL1 and GSL2, and ground selection transistors in different rows may be connected to different ground selection lines. For example, ground selection transistors GST of the cell strings CS11 and CS12 in the first row may be connected to the first ground selection line GSL1, and ground selection transistors GST of the cell strings CS21 and CS22 in the second row may be connected to the second ground selection line GSL2.

Connected in common to a word line may be memory cells that are arranged at the same height (or order) from the substrate (or the ground selection transistors GST). Connected to different word lines WL1 through WL6 may be memory cells that are arranged at different heights (or orders). For example, the memory cells MC1 may be connected in common to the word line WL1, the memory cells MC2 may be connected in common to the word line WL2, and the memory cells MC3 may be connected in common to the word line WL3. The memory cells MC4 may be re connected in common to the word line WL4, the memory cells MC5 may be connected in common to the word line WL5, and the memory cells MC6 may be connected in common to the word line WL6.

In first string selection transistors SSTa, which may be disposed at the same height (or order), of the cell strings CS11 to CS21 and CS12 to CS22, control gates of the first string selection transistors SSTa in different rows may be connected to different string selection lines SSL1a and SSL2a. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a.

In second string selection transistors SSTb, which may be disposed at the same height (or order), of the cell strings CS11 to CS21 and CS12 to CS22, the second string selection transistors SSTb in different rows may be connected to the different string selection lines SSL1b and SSL2b. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b.

According to an exemplary embodiment on the present inventive concept, cell strings CS in different rows may be connected to different string selection lines SSL. String selection transistors SST, which may be disposed at the same height (or order), of cell strings CS in the same row may be connected to the same string selection line SSL. String selection transistors SST, which may be disposed at different heights (or orders), of cell strings CS in the same row may be connected to different string selection lines SSL.

In exemplary embodiments of the present inventive concept, string selection transistors SST of cell strings CS in the same row may be connected in common to a string selection line SSL. For example, string selection transistors SSTa and SSTb of cell strings CS11 and CS12 in the first row may be connected in common to a string selection line SSL, and string selection transistors SSTa and SSTb of cell strings CS21 and CS22 in the second row may be connected in common to a string selection line SSL.

Columns of the cell strings CS11 to CS21 and CS12 to CS22 may be connected to different bit lines BL1 and BL2, respectively. For example, string selection transistors SSTb of the cell strings CS11 and CS21 in the first column may be connected in common to the bit line BL1, and string selection transistors SSTb of the cell strings CS12 and CS22 in the second column may be connected in common to the bit line BL2.

The cell strings CS11 and CS12 may form a first plane, and the cell strings CS21 and CS22 may form a second plane.

In the memory block BLKa, memory cells in each plane having the same height may form a physical page. The physical page may be a write/read unit of memory cells MC1 to MC6. A plane of the memory block BLKa may be selected, for example, by string selection lines SSL1a, SSL1b, SSL2a, and SSL2b. Connected to the bit lines BL1 and BL2 may be cell strings CS11 and CS12 of the first plane when a turn-on voltage is applied to the string selection lines SSL1a and SSL1b and a turn-off voltage is supplied to the string selection lines SSL2a and SSL2b. That is, the first plane may be selected. Connected to the bit lines BL1 and BL2 may be cell strings CS21 and CS22 of the second plane when a turn-on voltage is applied to the string selection lines SSL2a and SSL2b and a turn-off voltage is supplied to the string selection lines SSL1a and SSL1b. That is, the second plane may be selected. In a selected plane, a row of memory cells may be selected by word lines WL1 to WL6. In a selected row, a selection voltage may be applied to the second word line WL2, and a non-selection voltage may be applied to remaining word lines WL1 and WL3 to WL6. A physical page corresponding to the second word line WL2 in the second plane may be selected by adjusting voltages of the string selection lines SSL1a, SSL1b, SSL2a, and SSL2b and the word lines WL1 to WL6. A write or read operation may be performed with respect to memory cells MC2 in a selected physical page.

Two or more bits may be written at each memory cell MC. Bits written at memory cells MC belonging to a physical page may form logical pages. First bits written at memory cells MC belonging to a physical page may form a first logical page. N-th bits written at memory cells MC belonging to a physical page may form an N-th logical page. A logical page may be a data access unit. When a read operation is performed with respect to a physical page, data may be accessed by the logical page.

An erase operation on the memory block BLKa may be performed by the block or by the sub block. All of memory cells of the memory block BLKa may be erased based on an erase request (e.g., an erase request from an external memory controller) when the erase operation is performed by the memory block. When the erase operation is performed by the sub block, a part of memory cells of the memory block BLKa may be erased, and the rest thereof may be erase-inhibited. A low voltage (e.g., a ground voltage or a low voltage having a level similar to that of the ground voltage) may be supplied to a word line connected to memory cells to be erased, and a word line connected to memory cells to be erase-inhibited may be floated.

The memory block BLKa according to an exemplary embodiment of the present inventive concept is illustrated in FIG. 11. However, exemplary embodiments of the present inventive concept are not limited thereto. For example, the number of rows of cell strings may be increased or decreased, as desired. If the number of rows of cell strings is changed, the number of string or ground selection lines and the number of cell strings connected to a bit line may also be changed.

The number of columns of cell strings may be increased or decreased, as desired. If the number of columns of cell strings is changed, the number of bit lines connected to columns of cell strings and the number of cell strings connected to a string selection line may also be changed.

A height of the cell strings may be increased or decreased. For example, the number of ground selection transistors, memory cells, or string selection transistors that are stacked in each cell string may be increased or decreased.

In exemplary embodiments of the present inventive concept, memory cells MC in a physical page may correspond to at least three logical pages. For example, k bits (e.g., k may be an integer of 2 or more) may be programmed at a memory cell MC. In memory cells MC in one physical page, k bits programmed at memory cells MC may form k logical pages.

In an exemplary embodiment of the present inventive concept, a three dimensional (3D) memory array may be provided. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" may mean that layers of each level of the array are directly deposited on the layers of each underlying level of the array.

In an exemplary embodiment of the present inventive concept, the 3D memory array may include vertical NAND strings that are vertically oriented such that at least one memory cell is disposed over another memory cell. The at least one memory cell may include a charge trap layer. Each vertical NAND string may include at least one select transistor disposed over memory cells. The at least one select transistor may have substantially the same structure as the memory cells and may be formed monolithically together with the memory cells.

The following patent documents, the disclosure of which is incorporated by reference herein in its entirety, describe exemplary configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 12:
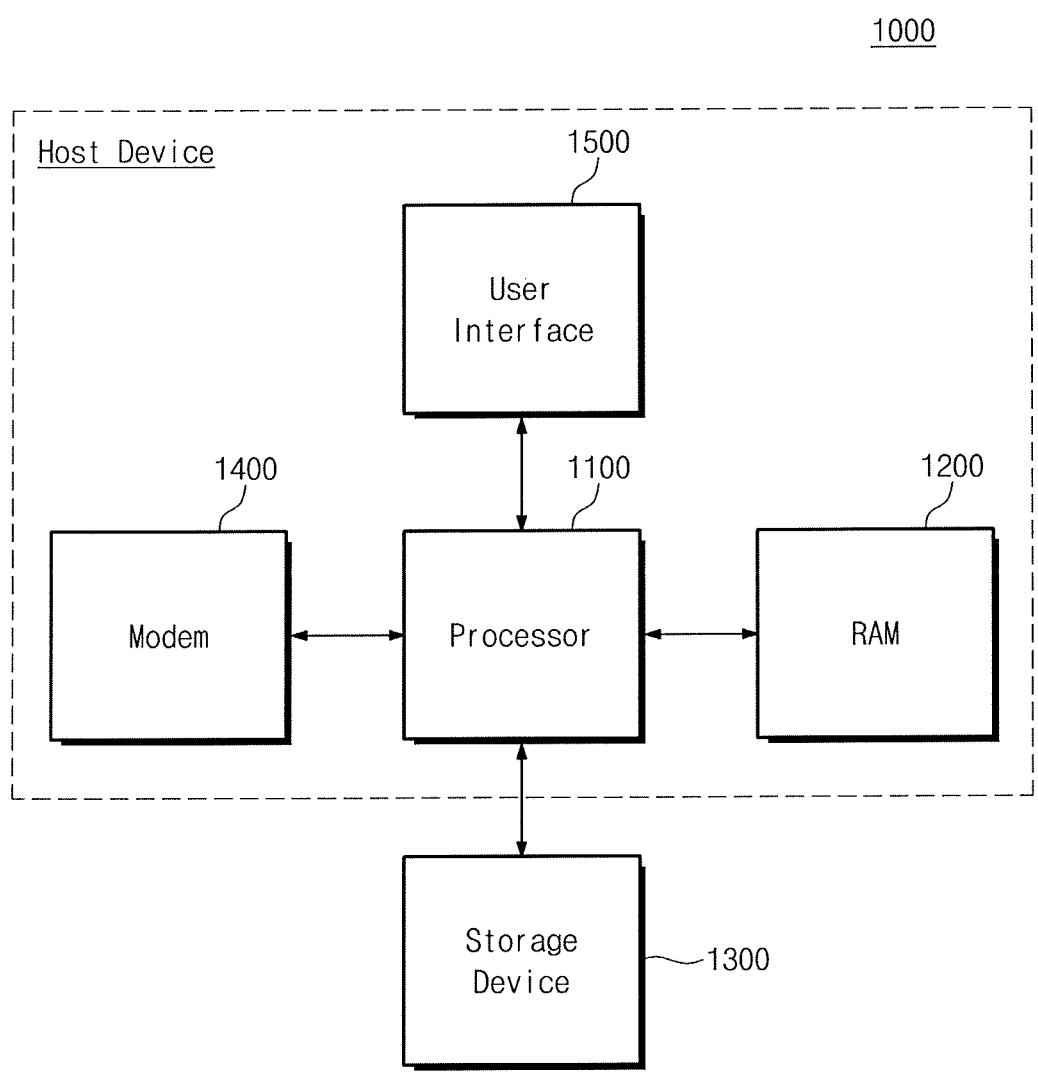
FIG. 12 is a block diagram schematically illustrating a computing device according to an exemplary embodiment of the present inventive concept.

FIG. 12 is a block diagram schematically illustrating a computing device according to an exemplary embodiment of the present inventive concept. Referring to FIG. 12, a computing device 1000 may include a processor 1100, a memory (e.g., RAM) 1200, a storage device 1300, a modem 1400, and a user interface 1500.

The processor 1100 may control an overall operation of the computing device 1000 and may perform a logical operation. The processor 1100 may include a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data in the RAM 1200 temporarily. The processor 1100 may execute codes using the RAM 1200 to process data. The processor 1100 may execute a variety of software, such as, but not limited to, an operating system and an application, using the RAM 1200. The processor 1100 may control an overall operation of the computing device 1000 using the RAM 1200. The RAM 1200 may include a volatile memory such as, but not limited to, a SRAM, a DRAM, and a SDRAM or a nonvolatile memory such as, but not limited to, a PRAM, MRAM, a RRAM, and a FRAM.

The storage device 1300 may communicate with the processor 1100. The storage device 1300 may be used to store data for a relatively long time. That is, the processor 1110 may store data, which is to be stored for a relatively long time, in the storage device 1300. The storage device 1300 may store a boot image for driving the computing device 1000. The storage device 1300 may store source codes of a variety of software, such as an operating system and an application. The storage device 2300 may store data that is processed by a variety of software, such as an operating system and an application.

In exemplary embodiments of the present inventive concept, the processor 1100 may load source codes stored in the storage device 1300 on the RAM 1200. The codes loaded on the RAM 1200 may be executed to run a variety of software, such as operating system and an application. The processor 1100 may load data stored in the storage device 1300 on the RAM 1200 and may process data loaded on the RAM 1200. The processor 1100 may store long-term data of data stored in the RAM 1200 at the storage device 1300.

The storage device 1300 may include a nonvolatile memory, such as, but not limited to, a flash memory, a PRAM, a MRAM, a RRAM, or a FRAM.

The modem 1400 may communicate with an external device in response to a control of the processor 1100. For example, the modem 2400 may communicate with the external device in a wired or wireless manner. The modem 1400 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, and MID (Radio Frequency Identification or wired communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), and eMMC (embedded MMC).

The user interface 1500 may communicate with a user under a control of the processor 1100. For example, the user interface 1500 may include user input interfaces such as a keyboard, a keypad, a button, a touch panel, a touch screen, a touch pad, a touch ball, a camera, a microphone, a gyroscope sensor, and a vibration sensor. The user interface 1500 may further include user output interfaces such as an LCD, an OLED (Organic Light Emitting Diode) display device, an AMOLED (Active Matrix OLED) display device, an LED, a speaker, and a motor.

The storage device 1300 may include a storage device 1300 according to an exemplary embodiment of the present inventive concept. The processor 1100, the RAM 1200, the modem 1400, and the user interface 1500 may form a host device that communicates with the storage device 1300.

In exemplary embodiments of the present inventive concept, the computing device 1000 may include a temperature sensor or may receive temperature information from the temperature sensor 140 (see, e.g., FIG. 1) disposed in the storage device 1300. As described with reference to FIGS. 1 to 8, for example, the processor 1100 may operate in the first mode M1, the second mode M2 or the third mode M3 based on a temperature detected by the temperature sensor 140.

In the first mode M1, the processor 1100 may operate at a fixed full speed without delay. The processor 1100 may detect a temperature from the temperature sensor 140 periodically or at predetermined time points.

In the second mode M2, the processor 1100 may operate having a delay (e.g., an intended or artificial delay) varying with a temperature and may operate at a speed varying with the temperature. The processor 1100 may detect a temperature from the temperature sensor periodically or based on a fine control period varying with the temperature.

In the third mode M3, the processor 1100 may operate at a fixed minimum speed. The processor 1100 may detect a temperature from the temperature sensor periodically or at predetermined time points.

In other exemplary embodiments of the present inventive concept, the RAM 1200, the modem 1400, or the user interface 1500 may operate in the first mode M1, the second mode M2, or the third mode M3 based on a temperature. For example, the RAM 1200, the modem 1400, or the user interface 1500 may operate in the first mode M1, the second mode M2, or the third mode M3 under an internal control or a control of the processor 1100.

According to an exemplary embodiment of the present inventive concept, a temperature detection period and operating performance of a storage device may be adjusted according to a temperature, thus reducing or preventing the operating performance from being excessively reduced due to an increase in a temperature and thus increasing an operating speed of the storage device.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A storage device comprising:
   a plurality of nonvolatile memory devices;
   a temperature sensor configured to detect a temperature of the storage device to output temperature information; and
   a memory controller configured to access at least one of the nonvolatile memory devices in response to a request from an external host device, wherein the memory controller is configured to obtain the temperature information from the temperature sensor with a first period in a first mode, and to obtain the temperature information from the temperature sensor with a second period in a second mode, and wherein the second period is shorter than the first period,
   wherein in the first mode, the first operating speed is a fixed operating speed,
   wherein in the second mode, the memory controller is configured to operate at a second operating speed, wherein the second operating speed is variable according to the temperature information and the second operating speed is lower than the first operating speed,
   wherein in a third mode, the memory controller is configured to operate at a third operating speed, and wherein the third operating speed is fixed and the third operating speed is lower than the second operating speed.

2. The storage device of claim 1, wherein the memory controller is configured to operate at a first operating speed in the first mode and to operate at a second operating speed, lower than the first operating speed, in the second mode.

3. The storage device of claim 1, wherein the memory controller is configured to operate in the first mode when the temperature information indicates a temperature lower than a first temperature,
   wherein the memory controller is configured to operate in the second mode when the temperature information indicates a temperature higher than or equal to the first temperature and lower than a second temperature higher than the first temperature, and
   wherein the memory controller is configured to operate in a third mode when the temperature information indicates a temperature higher than or equal to the second temperature.

4. The storage device of claim 1, wherein in the first mode, the first period is a fixed time period,
   wherein in the second mode, the second period is a variable time period, and
   wherein in a third mode, the memory controller is configured to obtain the temperature information from the temperature sensor according to a third period, wherein the third period is a fixed time period.

5. The storage device of claim 1, wherein in the second mode, the memory controller is configured to adjust the second period based on the temperature information.

6. The storage device of claim 1, wherein in the second mode, the memory controller is configured to decrease the second period as a temperature corresponding to the temperature information increases and to increase the second period as the temperature corresponding to the temperature information decreases.

7. The storage device of claim 1, wherein in the second mode, the memory controller is configured to adjust an operating speed of the memory controller based on the temperature information.

8. The storage device of claim 1, wherein in the second mode, the memory controller is configured to decrease an operating speed of the memory controller as a temperature corresponding to the temperature information increases and to increase the operating speed of the memory controller as the temperature corresponding to the temperature information decreases.

9. The storage device of claim 1, wherein in the second mode, the memory controller is configured to calculate a difference between a previously detected temperature and a currently detected temperature and to adjust at least one of the second period or an operating speed of the memory controller based on the calculated difference.

10. The storage device of claim 1, wherein in the second mode, the memory controller is configured to increase or decrease at least one of the second period or an operating speed of the memory controller in a binary search algorithm, based on whether a temperature corresponding to the temperature information increases or decreases.

11. The storage device of claim 1, wherein in the second mode, the memory controller is configured to adjust an operating speed of the memory controller based on the temperature information to maintain a temperature corresponding to the temperature information.

12. The storage device of claim 1, wherein the nonvolatile memory comprises cell strings arranged on a substrate, and wherein each of the cell string includes at least one selection transistor and memory cells stacked in a direction perpendicular to the substrate.

13. The storage device of claim 12, wherein the at least one selection transistor and the memory cells are charge trap type transistors.

14. A solid state drive comprising:
a plurality of nonvolatile memory devices;
a random access memory;
a temperature sensor, wherein the temperature sensor is configured to detect a temperature of the solid state drive, and wherein the temperature sensor is configured to output temperature information and store temperature information in the random access memory; and
a memory controller comprising a temperature manager, wherein the temperature manager is configured to obtain the temperature information from the temperature sensor with a first period in a first mode, wherein the temperature controller is configured to obtain the temperature information from the temperature sensor with a second period in a second mode, and wherein the second period is shorter than the first period,
wherein in the first mode, the first operating speed is a fixed operating speed,
wherein in the second mode, the memory controller is configured to operate at a second operating speed which is slower than the first operation speed and decrease the second operating speed of the memory controller as a temperature corresponding to the temperature information increases and to increase the second operating speed of the memory controller as the temperature corresponding to the temperature information decreases, and
wherein in third mode, the memory controller is configured to operate at a third operating speed which is fixed and the third operating speed is lower than the second operating speed.

15. The storage device of claim 14, wherein the memory controller is configured to operate in the first mode when the temperature information indicates a temperature lower than a first temperature,
wherein the memory controller is configured to operate in the second mode when the temperature information indicates a temperature higher than or equal to the first temperature and lower than a second temperature higher than the first temperature, and
wherein the memory controller is configured to operate in the third mode when the temperature information indicates a temperature higher than or equal to the second temperature.

16. The storage device of claim 14, wherein in the first mode, the first period is a fixed time period,
wherein in the second mode, the second period is a variable time period, and
wherein in the third mode, the temperature manager is configured to obtain the temperature information from the temperature sensor according to a third period, wherein the third period is a fixed time period.

17. The storage device of claim 14, wherein in the second mode, the memory controller is configured to adjust the second period based on the temperature information.

18. An operating method of a memory controller configured to control a plurality of nonvolatile memory devices, the operating method comprising:
receiving a first temperature information detected by a temperature sensor with a first period while an operation speed is a first speed which is fixed;
reducing an operation speed of the memory controller to a second speed which is variable and slower than the first speed when a first temperature is higher than a first reference temperature; and
requesting the temperature sensor to detect a second temperature information with a second period which is shorter than the first period,
controlling a memory controller to reduce the operation speed to a third speed which is fixed and slower than the second speed when a second temperature is higher than a second reference temperature; and
requesting the temperature sensor to detect a third temperature information with a third period which is longer than the second period.

19. The operating method of claim 18, wherein in the second mode, the memory controller is configured to decrease an operating speed of the memory controller as a temperature corresponding to the temperature information increases and to increase the operating speed of the memory controller as the temperature corresponding to the temperature information decreases.

* * * * *